United States Patent
Pinna (10) Patent No.: US 8,890,735 B2
(45) Date of Patent: Nov. 18, 2014

(54) MULTI-LEVEL SIGMA-DELTA ADC WITH REDUCED QUANTIZATION LEVELS

(71) Applicant: ST-Ericsson SA, Plan-les-Ouates (CH)

(72) Inventor: Carlo Pinna, Milan (IT)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 14/351,059

(22) PCT Filed: Oct. 8, 2012

(86) PCT No.: PCT/EP2012/069818
§ 371 (c)(1),
(2), (4) Date: Apr. 10, 2014

(87) PCT Pub. No.: WO2013/053659
PCT Pub. Date: Apr. 18, 2013

(65) Prior Publication Data
US 2014/0247169 A1   Sep. 4, 2014

Related U.S. Application Data

(60) Provisional application No. 61/549,462, filed on Oct. 20, 2011.

(30) Foreign Application Priority Data

Oct. 13, 2011   (EP) .................................. 11185107

(51) Int. Cl.
*H03M 3/00*   (2006.01)

(52) U.S. Cl.
CPC ..................................... *H03M 3/422* (2013.01)
USPC ........... 341/143; 341/155; 341/136; 341/160; 375/252; 375/247

(58) Field of Classification Search
CPC ........... H03M 3/00; H03M 3/02; H03M 3/35; H03M 3/45; H03M 3/49; H03M 3/486; H03M 3/448; H03M 3/492; H03M 3/454; H03M 3/424; H03M 3/464; H03M 3/438; H03M 3/502; H03M 3/334; H03M 3/358; H03M 3/452; H03M 7/3026; H03M 7/3031; H04B 14/06
USPC ............................ 341/135–160; 375/252.247
See application file for complete search history.

(56) References Cited

U.S. PATENT DOCUMENTS 5,627,536 A   5/1997   Ramirez
6,304,608 B1 * 10/2001   Chen et al. .................... 341/143

(Continued)

FOREIGN PATENT DOCUMENTS

EP   2141814 A1   1/2010

OTHER PUBLICATIONS

Bonizzoni et al. "Third-Order Sigma-Delta Modulator with 61-dB SNR and 6-MHz Bandwidth consuming 6 mW." 34th European Solid-State Circuits Conference; XP055020420; Sep. 1, 2008; pp. 218-221.

(Continued)

*Primary Examiner* — Lam T Mai
(74) *Attorney, Agent, or Firm* — Coats & Bennett, P.L.L.C.

(57) ABSTRACT

A multi-level sigma-delta Analog to Digital converter provides multi-level outputs using a quantizer with reduced quantization levels. The converter comprises a direct path comprising a computation block, an analog integrator and the quantizer with reduced quantization levels. Further, the converter comprises a feedback path arranged to provide to the computation block a feedback analog signal. The direct path comprises a first amplification block having a gain factor which is the inverse of the gain factor of a second amplification block of the feedback path. The converter allows reduction of the complexity of the quantizer.

14 Claims, 4 Drawing Sheets

(56) References Cited

U.S. PATENT DOCUMENTS

| | | | |
|---|---|---|---|
| 6,927,720 B2 * | 8/2005 | Matsumoto | 341/143 |
| 7,075,995 B2 * | 7/2006 | Su | 341/143 |
| 7,423,567 B2 | 9/2008 | Melanson | |
| 7,538,705 B2 * | 5/2009 | Deval et al. | 341/143 |
| 7,548,178 B2 * | 6/2009 | Delano | 341/143 |
| 7,800,524 B2 * | 9/2010 | Lee et al. | 341/143 |
| 7,948,414 B2 | 5/2011 | Lin et al. | |
| 8,736,473 B2 | 5/2014 | Dijkmans et al. | |
| 2003/0081687 A1 | 5/2003 | Su | |
| 2005/0093725 A1 | 5/2005 | McDaniel et al. | |
| 2007/0210947 A1 | 9/2007 | Delano | |
| 2008/0062026 A1 | 3/2008 | Melanson | |
| 2008/0150777 A1 | 6/2008 | Rangan et al. | |
| 2010/0164769 A1 | 7/2010 | Lee et al. | |

OTHER PUBLICATIONS

Fraser et al. "Stability Analysis of Multiple-Feedback Oversampled Sigma-Delta A/D Converter Configurations." 43rd IEEE Midwest Symposium on Circuits and Systems; XP010558596; Aug. 8, 2000; pp. 676-679; vol. 2.

Pena-Perez et al. "Double-Sampling Analog-Look-Ahead Second Order Sigma-Delta Modulator with Reduced Dynamics." IEEE International Symposium on Circuits and Systems; May 30, 2010, pp. 2422-2425, IEEE.

* cited by examiner

MULTI-LEVEL SIGMA-DELTA ADC WITH REDUCED QUANTIZATION LEVELS

TECHNICAL FIELD

The present invention relates to Analog-to-Digital Converter circuits (ADCs) and particularly to a multi-level sigma-delta ADC with reduced quantization levels.

BACKGROUND ART

Analog-to-Digital Converter circuits (ADCs) are often implemented with Sigma-Delta topologies when high accuracy is required.

An example of application is in the audio field, where Sigma-Delta ADCs are the most commonly used.

As known, this topology of converters transforms an analog input signal to a digital stream of words with a low number of bits and a spectrally-shaped quantization noise.

The first Sigma-Delta converters had a single bit output (2 levels), then they evolved to multi-level outputs thanks to the usage of new design techniques.

The multi-level solution has the advantage of reducing the quantization noise at the cost of an increased complexity of the ADCs.

For this reason the output bits of these converters are mainly in the range of one (2 levels) to 5 (32 levels) and more rarely they go beyond these numbers.

Figure 1:
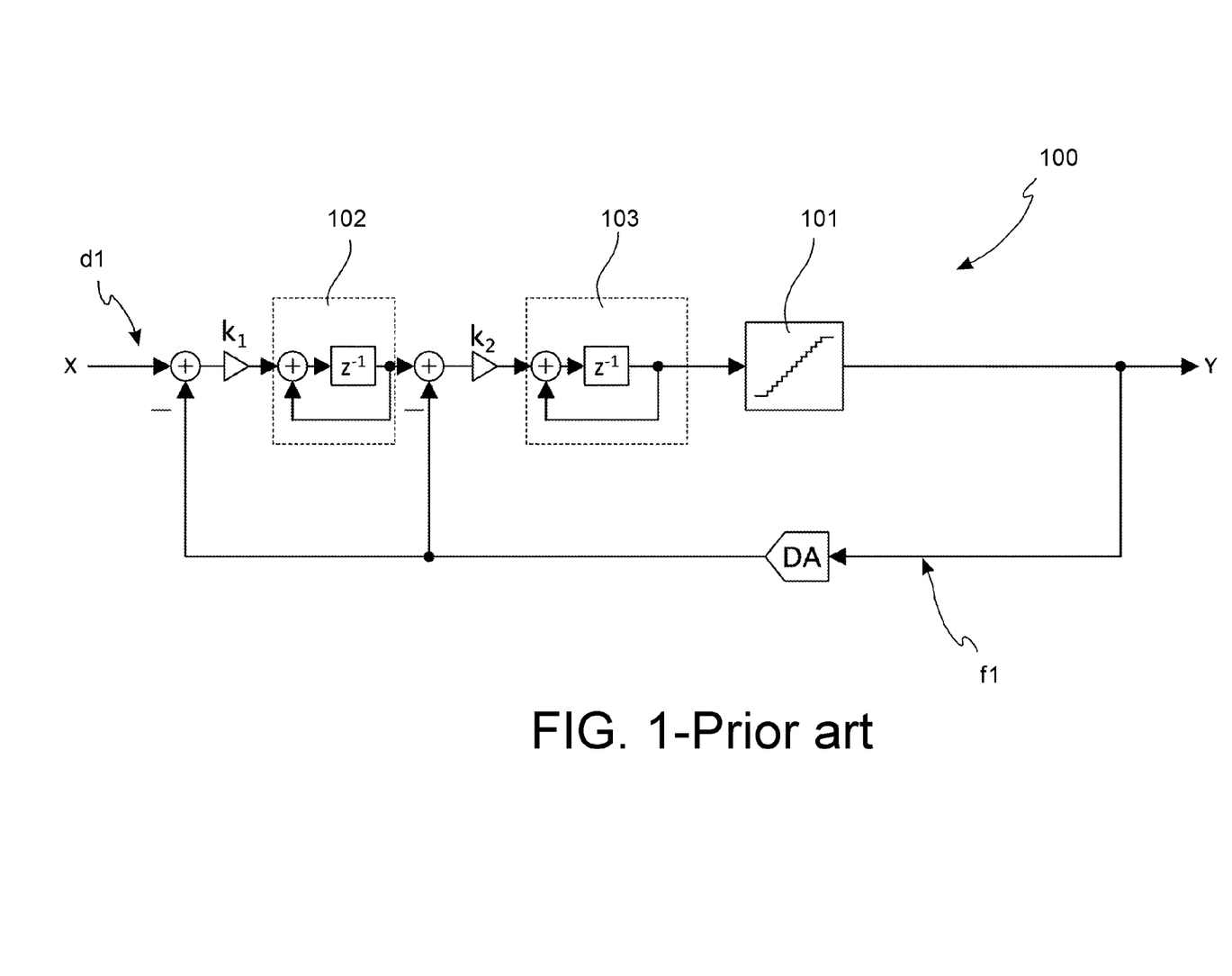
FIG. 1 shows a block diagram of a multi-level sigma-delta AD converter of the prior art.

FIG. 1 shows a multi-level second-order sigma-delta converter 100 of the prior art in which the shown quantizer 101 is L-levels.

The converter 100 of FIG. 1 is arranged to convert an input analog signal X into a stream of digital words Y.

The converter 100 includes a direct path d1 having a first analog integrator 102 and a second analog integrator 103 connected in series one another upstream the quantizer 101. The converter 100 further comprises a feedback path f1 arranged to subtract an analog signal corresponding the digital output signal Y from the input of the first analog converter 102 and the second analog converter 103, respectively.

As known, the quantizer must not introduce substantial delay in the direct path because the delay can cause instability, so the preferred solution to implement the quantizer is to do a flash-converter with a number of comparators equal to the output levels minus one (in this example L−1 comparators).

Other methods are possible to implement this block, but in any case low delay and L-levels accuracy is required.

In most cases the complexity of the quantizer is the limiting factor for the increase of the number of levels.

An example of multi level sigma-delta is described in the publication "Third-Order Sigma-Delta Modulator with 61-dB SNR and 6-MHz Bandwidth Consuming 6 mW", Bonizzoni et al., University of Pavia, 2008, IEEE.

US 2003/081687 A1 describes a three order sigma-delta modulator having a feedback and a feedforward configuration.

US 2010/164769 A1 discloses a sigma-delta modulator architecture capable of automatically improving dynamic range.

US 2007/210947 A1 relates to an arrangement of feedback resisters for the sigma-delata analog-to-digital converter (ADC).

SUMMARY OF THE INVENTION

An object of the present invention is to provide a multi-level sigma-delta AD converter with reduced quantization levels which is alternative to the ones of the cited prior art overcoming at least some of their drawbacks and limitations and reducing the quantizer accuracy needed.

A multi-level sigma-delta AD converter according to the invention comprises a direct path having an input terminal to receive an input analog signal and an output terminal to provide a output digital signal corresponding to said input analog signal. The direct path comprises a computation block arranged to receive a first analog signal representative of the input analog signal and to provide a analog computed signal, an analog integrator having an input terminal operatively associated to the computation block to receive the analog computed signal and a output terminal to provide a third analog signal, a quantizer having a respective input terminal operatively connected to the output terminal of the analog integrator and a respective output terminal operatively connected to the output terminal of the direct path. The converter comprises a first feedback path arranged to provide to the computation block a feedback analog signal representative of a digital signal present at the output terminal of the quantizer. The computation block is arranged to subtract said feedback analog signal from the first analog signal. The first feedback path comprises an amplification block having a respective gain factor. The direct path comprises a first amplification block interposed between said computational block and the input terminal of the quantizer. The first amplification block of the direct path has a respective gain factor which is the inverse of the gain factor of the amplification block of the first feedback path.

An embodiment of the invention is a digital audio device comprising a multi-level sigma-delta AD converter.

BRIEF DESCRIPTION OF THE DRAWINGS

The characteristics and the advantages of the present multi-level sigma-delta AD converter will be better understood from the following detailed description of embodiments thereof, which is given by way of illustrative and non-limiting example with reference to the annexed drawings, in which.

DETAILED DESCRIPTION OF PREFERRED EMBODIMENTS

Block diagram of a preferred embodiment of a multi-level sigma-delta Analog-to-Digital (AD) converter of the invention can be described with reference to FIG. 2.

A digital audio device (described in the following with reference to FIG. 4) comprises the multi-level sigma-delta AD converter according to the invention.

The digital audio device can be used in any portable equipments with audio signals, e.g. mobile or cellular phone, MP3 players, PDAs (Personal Digital Assistant), portable computers, tablets, and so on.

Figure 2:
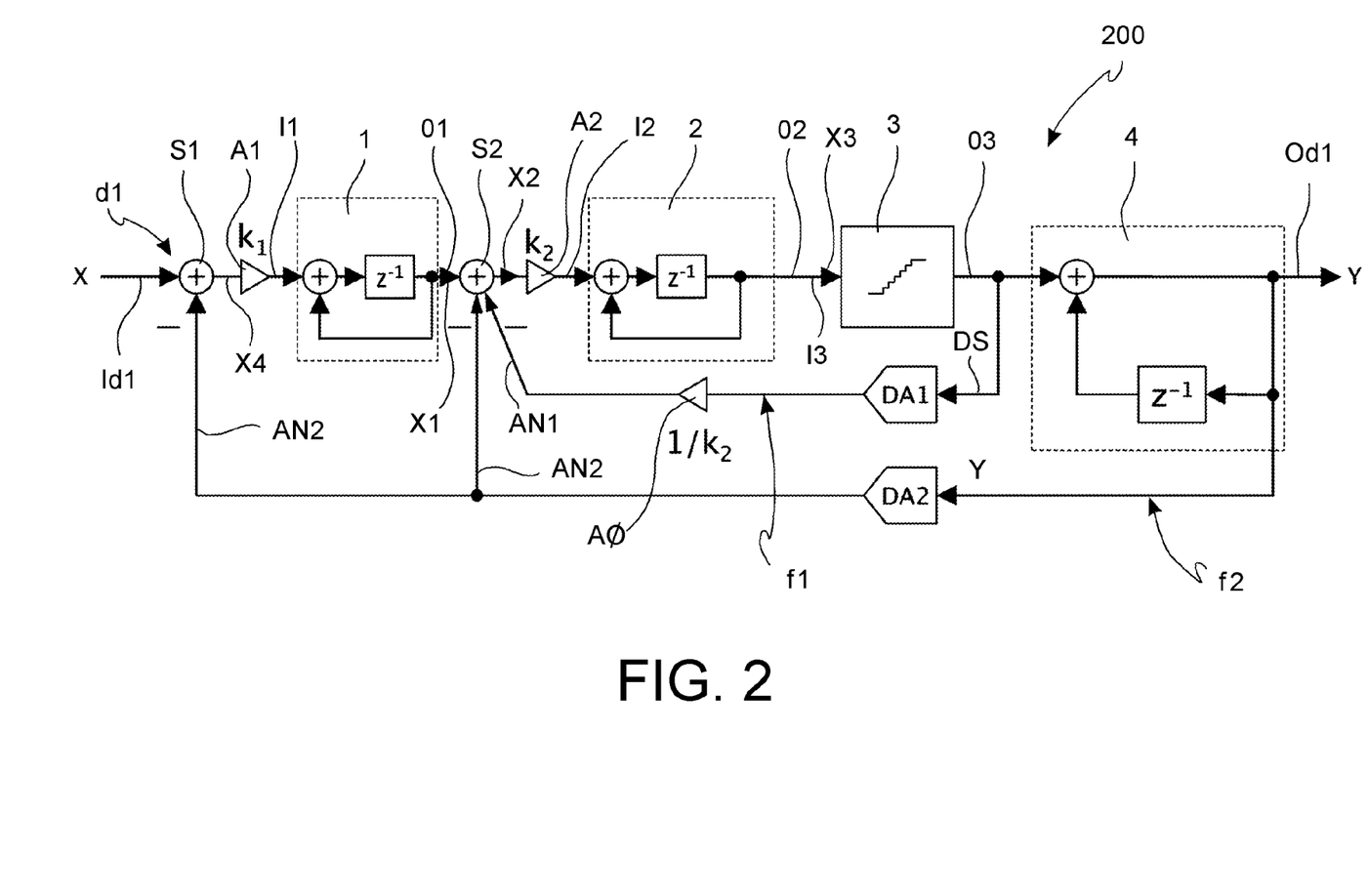
FIG. 2 shows a block diagram of a multi-level sigma-delta AD converter according to a first embodiment of the invention.

With reference to FIG. 2, the multi-level sigma-delta AD converter 200, in the following also simply converter 200, comprises a direct path d1 having an input terminal Id1 to receive an input analog signal X and an output terminal Od1 to provide an output digital signal Y corresponding to the input analog signal X.

The output digital signal Y is a digital stream of words with a number of bits depending on the number of levels of the converter 200. As an example, in the case of a 32-level sigma-delta AD converter, the output digital signal Y is a digital stream of words with 5 bits.

The direct path d1 of the converter 200 comprises a computation block S2, e.g. an adder, arranged to receive a first analog signal X1 representative of the input analog signal X and to provide an analog computed signal X2.

In addition, the direct path d1 of the converter 200 comprises an analog integrator 2, e.g. a first order analog integrator, having an input terminal I2 operatively associated to the computation block S2 to receive the analog computed signal X2 and an output terminal O2 to provide a third analog signal X3.

As an example of internal structure, the analog integrator 2 comprises a respective direct path comprising an adder block and delay block connected in series one another. The adder block has an input terminal corresponding to the input terminal I2 of the analog integrator 2 and an output terminal connected to the input terminal of the delay block. The delay block has an output terminal corresponding to the output terminal O2 of the analog integrator 2. The analog integrator further comprises a respective feedback path to provide to a further input terminal of the adder block the third analog signal X3 present at the output terminal O2 of the analog integrator 2.

The direct path d1 of the converter 200 further comprises a quantizer 3 having a respective input terminal I3 operatively connected to the output terminal O2 of the analog integrator 2 and a respective output terminal O3 operatively connected to the output terminal Od1 of the direct path d1.

It should be noted that, obviously, the portion of the direct path d1 of the converter 200 before the quantizer 3 is in the analog domain and the portion of the direct path d1 of the converter 200 after the quantizer 3 is in the digital domain.

Particularly, the quantizer 3 has a reduced number of quantization levels, e.g. 8 quantization levels, depending on the architecture of the converter 100 according to the invention, as it will be explained in the following.

In particular, according to the invention, the converter 200 is of the L-levels sigma-delta AD type (e.g., L=32) with a quantizer with r-levels (r<L, e.g. r=8). An example of quantizer 3 is a flash converter having a number of comparators equal to r−1.

With reference again to the converter 200, it advantageously comprises a first feedback path f1 arranged to provide to the computation block S2 a feedback analog signal AN1 representative of a digital signal DS present at the output terminal O3 of the quantizer 3.

In addition, the computation block S2 is arranged to subtract said feedback analog signal AN1 from the first analog signal X1.

In more detail, in order to do so, the computation block S2 is preferably configured to change from positive to negative the sign of the feedback analog signal AN1 received from the first feedback path f1 of the converter 200.

The first feedback path f1 of the converter 200 comprises an amplification block A0 having a respective gain factor 1/K2.

In addition, in order to convert the digital signal DS present at the output terminal O3 of the quantizer 3 in a corresponding analog signal to be provided to the amplification block A0, the first feedback path f1 further comprises a Digital-to-Analog (DA) converter DA1, e.g. a flash DA converter, interposed between the output terminal O3 of the quantizer 3 and the amplification block A0.

With reference again to the converter 200, the direct path d1 comprises a first amplification block A2 interposed between the computational block S2 and the input terminal I3 of the quantizer 3.

Advantageously, the first amplification block A2 of the direct path d1 has a respective gain factor K2 which is the inverse of the gain factor 1/K2 of the amplification block A0 of the first feedback path f1.

In the embodiment of the FIG. 2, the first amplification block A2 of the direct path d1 is interposed between the computation block S2 and the analog integrator 2.

According to a further embodiment (not shown in the figure), the first amplification block A2 of the direct path d1 is interposed between the analog integrator 2 and the quantizer 3.

The converter 200 of FIG. 2 further comprises a second feedback path f2 arranged to provide to the computation block S2 a further feedback analog signal AN2 representative of the output digital signal Y present at the output terminal Od1 of the direct path d1.

The computation block S2 is advantageously arranged to subtract said further feedback analog signal AN2 from the first analog signal X1.

In more detail, in order to do, the computation block S2 is preferably configured to change from positive to negative the sign of the further feedback analog signal AN2 received from the second feedback path f2 of the converter 200.

In order to convert the output digital signal Y present at the output terminal Od1 of the direct path d1 of the converter 200 in the further feedback analog signal AN2 to be provided to the computational block S2, it should be observed that also the second feedback path f2 further comprises a further Digital-to-Analog (DA) converter DA2, e.g. a flash DA converter, interposed between the output terminal Od1 of the direct path d1 of the converter 200 and the computational block S2.

Turning back to the converter 200, the direct path d1 comprises a further analog integrator 1, e.g. a first order analog integrator, having an input terminal I1 operatively connected to the input terminal Id1 of the direct path d1 and a output terminal O1 operatively connected to the computation block S2 to provide it the first analog signal X representative of the input analog signal X of the direct path d1.

As an example, the internal structure of the further analog integrator 1 is analogous to the internal structure of the analog integrator 2, previously described.

The direct path d1 of the converter 200 further comprises a further computation block S1, e.g. an adder, arranged to receive the input analog signal X and to provide a further analog computed signal X4 to the further analog integrator 1.

The second feedback path f2 of the converter 200 is further arranged to provide the feedback analog signal AN2 to the further computation block S1.

In addition, the further computation block S1 is arranged to subtract the further feedback analog signal AN2 from the first analog signal X1.

In more detail, in order to do so, the further computation block S1 is preferably configured to change from positive to negative the sign of the further feedback analog signal AN2 received from second feedback path f2 of the converter 200.

With reference again to the converter 200, the direct path d1 further comprises a second amplification block A1 interposed between the further computation block S1 and the computation block S2. The second amplification block A1 has a respective gain factor K1.

In the embodiment of FIG. 2, the second amplification block A1 of the direct path d1 is interposed between the further computation block S1 and the further analog integrator 1.

In accordance with a further embodiment (not shown in the figure), the second amplification block A1 of the direct path d1 is interposed between the further analog integrator 1 and the computation block S2.

Turning back to the converter 200, the direct path d1 further comprises a digital integrator block 4, e.g. a first order digital integrator, interposed between the output terminal O3 of the quantizer 3 and the output terminal Od1 of the converter 200.

In particular, the digital integrator block 4 is arranged to receive the digital signal DS present at the output terminal O3 of the quantizer 3 and to provide the corresponding output digital signal Y on the output terminal Od1 of the direct branch d1 and on the second feedback path f2 of the converter 200.

As an example of its internal structure, the digital integrator block 4 comprises a respective direct path comprising an adder block. The adder block has an input terminal corresponding to the input terminal of the digital integrator block 4 and an output terminal corresponding to the output terminal of the digital integrator block 4. The output terminal of the adder of the digital integrator block 4 is also connected to the second feedback path f2, particularly to the input terminal of the further digital-to-analog converter DA2. The digital integrator block 4 further comprises a respective feedback path comprising a delay block arranged to provide to a further input terminal of the adder block the output digital signal Y present at the output terminal Od1 of the digital integrator 4.

Figure 3:
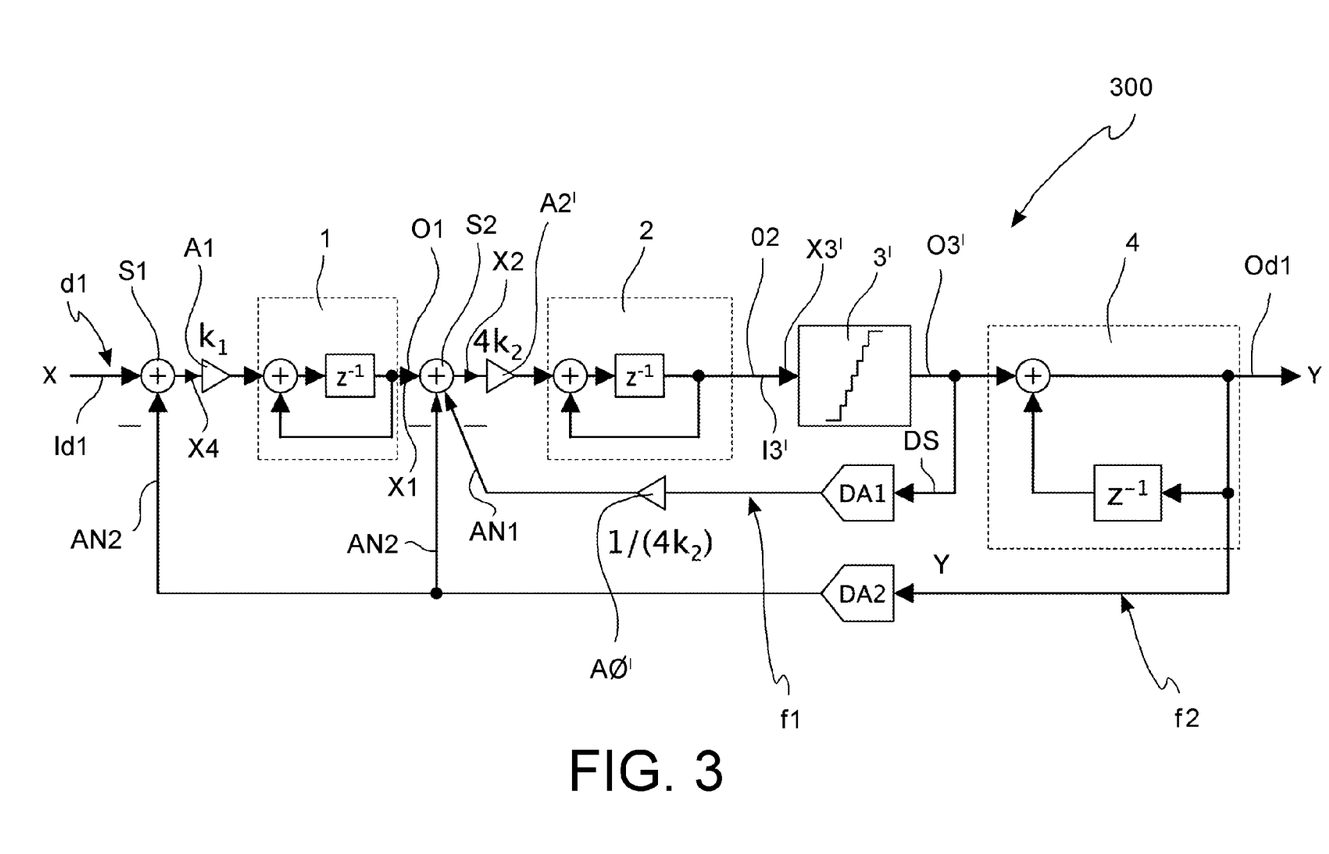
FIG. 3 shows a block diagram of a multi-level sigma-delta AD converter according to a second embodiment of the invention.

Block diagram of a further embodiment of a multi-level sigma-delta Analog-to-Digital (AD) converter of the invention can be described now with reference to FIG. 3.

The multi-level sigma-delta Analog-to Digital (AD) converter of FIG. 3, in the following also simply converter, is indicated by the reference number 300.

It should be observed that elements or components in common between the converter 200 of FIG. 2 and the converter 300 of FIG. 3 are indicated with the same reference number.

The converter 300 comprises a direct path d1 having an input terminal Id1 to receive an input analog signal X and an output terminal Od1 to provide an output digital signal Y corresponding to the input analog signal X.

The output digital signal Y is a digital stream of words with a number of bits depending on the number of levels of the converter 300 (in the case of a 32-level sigma-delta AD converter, the output digital signal Y is a digital stream of words with 5 bits).

The direct path d1 of the converter 300 comprises a computation block S2 and an analog integrator 2 analogous the ones described with reference to the converter 200 of FIG. 2.

The direct path d1 of the converter 300 further comprises a quantizer 3' having a respective input terminal I3' operatively connected to the output terminal O2 of the analog integrator 2 and a respective output terminal O3' operatively connected to the output terminal Od1 of the direct path d1.

The portion of the direct path d1 of the converter 300 before the quantizer 3' is in the analog domain and the portion of the direct path d1 of the converter 300 after the quantizer 3 is in the digital domain.

Particularly, the quantizer 3' has a reduced number of quantization levels, e.g. 8 quantization levels, depending on the architecture of the converter 100 according to the invention.

In particular, according to the invention, also the converter 300 is of the L-levels sigma-delta AD type (e.g., L=32) with a quantizer with r-levels (r<L, e.g. r=8). An example of quantizer 3' is a flash converter having a number of comparators equal to r−1.

With respect to the quantizer 3 of the converter 200 of FIG. 2, the quantizer 3' has an accuracy more relaxed than the accuracy of the quantizer 3.

In great detail, the accuracy of the quantizer depends on the thresholds of the comparators, which can be generated in many ways related to the implementation of the converter.

The difference between the quantizer 3 of the embodiment of FIG. 2 and the quantizer 3' of the embodiment of FIG. 3 is the positioning of the thresholds of the comparators. It should be noted that this does not involve a change in the complexity in putting them at different values.

The converter 300 comprises a first feedback path f1 arranged to provide to the computation block S2 a feedback analog signal AN1 representative of a digital signal DS present at the output terminal O3' of the quantizer 3'. The computation block S2 is arranged to subtract said feedback analog signal AN1 from the first analog signal X1.

In more detail, in order to do so, the computation block S2 is preferably configured to change from positive to negative the sign of the feedback analog signal AN1 received from the first feedback path f1 of the converter 200.

The first feedback path f1 of the converter 300 comprises an amplification block A0' having a respective gain factor ¼K2.

In addition, in order to convert the digital signal DS present at the output terminal O3' of the quantizer 3' in a corresponding analog signal to be provided to the amplification block A0', the first feedback path f1 further comprises a Digital-to-Analog (DA) converter DA1 analogous to the DA converter described with reference to the converter 200 of FIG. 2, interposed between the output terminal O3' of the quantizer 3' and the amplification block A0'.

With reference again to the converter 300, the direct path d1 comprises a first amplification block A2' interposed between the computational block S2 and the input terminal I3' of the quantizer 3'.

Advantageously, the first amplification block A2' of the direct path d1 has a respective gain factor 4K2 which is the inverse of the gain factor ¼K2 of the amplification block A0' of the first feedback path f1.

Also in this further embodiment, the first amplification block A2' of the direct path d1 can be interposed between the computation block S2 and the analog integrator 2 or between the analog integrator 2 and the quantizer 3'.

It should be noted that in the embodiment of FIG. 2, the output terminal O2 of the analog integrator 2 is connected to the input terminal I3 of the quantizer 3 and its amplitude is reduced with respect to the solution of the prior art. Using this benefit, it has been possible to increase the gain factor of the first amplification block from K2 to 4K2 and advantageously reducing the accuracy needed for the quantizer 3, and then obtaining the further embodiment of the invention, i.e. the converter 300 of FIG. 3. In a corresponding way, the gain factor of the amplification block A2' of the first feedback path f1 is reduced from 1/k2 to ¼k2.

The relaxed accuracy of the quantizer 3' is related to the relaxed accuracy of the comparators used in the quantizer because in a flash converter the tolerated comparator error is generally indicated as a fraction of the least significant bit (LSB, which is the difference between two subsequent thresholds). In the case the LSB increases, the tolerated error increase.

In the embodiment of FIG. 3, with the gain factor of the first amplification block equal to 4K2, the LSB of the quantizer 3' is multiplied by four and therefore the tolerated comparator error of the quantizer 3' is multiplied by four (or, vice-versa, the accuracy of the quantizer 3' is reduced by four), while at the same time the accuracy of the converter 300 remains unchanged.

In view of the above, the solution of FIG. 3 advantageously allows to save cost than the solution of FIG. 2 maintaining the same performance of the converter.

The converter 300 of FIG. 3 further comprises a second feedback path f2 arranged to provide to the computation block S2 a further feedback analog signal AN2 representative of the output digital signal Y present at the output terminal Od1 of the direct path d1. The computation block S2 is advantageously arranged to subtract said further feedback analog signal AN2 from the first analog signal X1, as previously described.

In order to convert the output digital signal Y present at the output terminal Od1 of the direct path d1 of the converter 200 in the further feedback analog signal AN2 to be provided to the computational block S2, also the second feedback path f2 of the converter 300 further comprises a further Digital-to-Analog (DA) converter DA2, analogous to the one described with reference to the converter 200 of FIG. 2.

Turning back to the converter 300, the direct path d1 comprises a further analog integrator 1 which is analogous to the further analog integrator previously described with reference to the embodiment of FIG. 2.

The direct path d1 of the converter 300 further comprises a further computation block S1, e.g. an adder, analogous to the one described with reference to the converter 200 of FIG. 2.

The second feedback path f2 of the converter 300 is further arranged to provide the feedback analog signal AN2 to the further computation block S1. The further computation block S1 is arranged to subtract the further feedback analog signal AN2 from the first analog signal X1, as previously described.

With reference again to the converter 300, the direct path d1 further comprises a second amplification block A1 interposed between the further computation block S1 and the computation block S2. The second amplification block A1 has a respective gain factor K1.

Also for the embodiment of FIG. 3, the second amplification block A1 of the direct path d1 can be interposed between the further computation block S1 and the further analog integrator 1 or between the further analog integrator 1 and the computation block S2.

Turning back to the converter 300, the direct path d1 further comprises a digital integrator block 4, e.g. a first order digital integrator, interposed between the output terminal O3' of the quantizer 3' and the output terminal Od1 of the converter 300.

The digital integrator block 4 of the converter 300, analogous to the digital integrator block 4 described with reference to the converter 200 of FIG. 2, is arranged to receive the digital signal DS present at the output terminal O3' of the quantizer 3' and to provide the corresponding output digital signal Y on the output terminal Od1 of the direct branch d1 and on the second feedback path f2 of the converter 300.

Taking the above considerations into account, the behavior of the converter 200 of the present invention is described below, with particular reference to the block diagram of the embodiment of FIG. 2.

The input analog signal X of the multi-level sigma-delta AD converter 200 is band limited when used in audio signals. Therefore, there is a correlation between a sample of the output digital signal Y(N) and the previous one Y(N−1). In other words, the difference between adjacent digital samples is small.

The inventor used this correlation to predict the next digital sample subtracting the predict digital sample present at the output of the quantizer 3 before the quantizer 3 so that the quantizer itself can be configured with a reduced number of quantization levels to work properly.

The quantizer 3 introduced an error Err so that the third analog signal X3 at the input terminal I3 of the quantizer 3 has amplitude Y-Err.

In the first feedback path f1, the previous output digital sample Y(N−1) (digital output signal DS present at the output terminal O3 of the quantizer) is converted in the analog domain by the DA converter DA1 and then subtracted from the first analog signal X1 by the computation block S2.

In addition, the previous output digital sample Y(N) present at the output terminal Od1 of the direct path d1 of the converter 200 is added back at the output terminal O3 of the quantizer 3 by the digital integrator block 4.

As a result, the third analog signal X3 at the input terminal of the quantizer 3 can be written as follows:

$$Y(N)-Y(N-1)-\text{Err}=\Delta Y(N)-\text{Err}$$ (third analog signal X3)

As known, the output digital signal Y of a multi-level sigma delta DA converter can be written as a function of the input analog signal X, as follows:

$$Y(N)=f(X(N))+Q(N)$$

wherein f is a signal transfer function and Q represents the noise shaped quantization noise.

It should be noted that in the previous equation it was considered the input analog signal X is a discrete time function X(N) but the same function can be considered as valid also in the case the input analog signal X is a continuous time function X(t).

As a consequence of the previous equation, in the estimation of the amplitude of $\Delta Y(N)$, there are two main terms, as follows:

$$\Delta Y(N)=\Delta f(X(N))+\Delta Q(N)$$

The first term depends on the input analog signal X and on its transfer function. The second term depends on the output quantization noise.

The first term can be small if the transfer function f is a low pass filter or if the input analog signal X is band limited, as in the case of audio signals.

In order to avoid aliasing, the input analog signal is filtered externally or by its transfer function f and therefore the first term can be small.

The second term is the difference between two successive quantization noises, so it can be assumed that the amplitude of $\Delta Q$ is roughly 2Q.

Then, it should be observed that the amplitude of Q is inversely proportional to the number of output levels L of the L-level sigma-delta AD converter 200 (32 in the example of FIG. 2), so for a high number L of levels the amplitude of $\Delta Q$ is small. These considerations can be written as follows:

$$\Delta Q=4Q0/L$$

wherein Q0 is the quantization noise of a converter having 2 output levels.

It should be noted that the same considerations are valid for the error Err introduced by the quantizer, and therefore:

$$\text{Err}=2\text{Err}0/L$$

wherein Err0 is the quantization error of 2 levels quantizer.

In conclusion, the third analog signal X3 present at the input terminal I3 of the quantizer 3 can be represented as follows:

$$Y(N)-Y(N-1)-\text{Err}=\Delta f(X(N))+(4Q0+2\text{Err}0)/L$$

If the number of output quantization levels L is big enough the amplitude signal is mainly dependent on the input analog signal X.

In the example of FIG. 2 (and also for the example of FIG. 3), having a converter 200 with 32 levels output, it is sufficient to arrange a quantizer 3 having 8 quantization levels.

Furthermore, the same quantizer 3 having 8 quantization levels can be used also in the case of a multi-level sigma-delta AD converter having 64 levels output.

Figure 4:
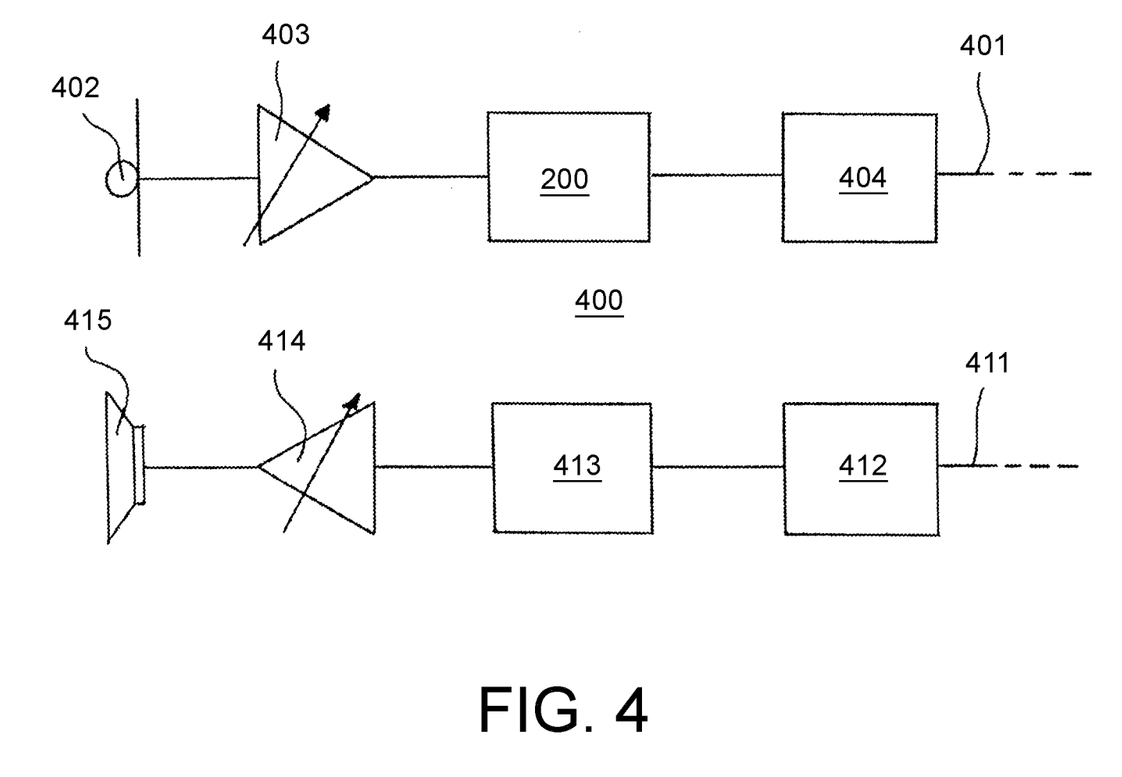
FIG. 4 shows a block diagram of a digital audio device employing the multi-level sigma-delta AD converter according to the invention.

With reference now to FIG. 4, an example of an digital audio device 400 employing the Analog-to Digital converter according to the invention is briefly described.

The digital audio device 400 is for example a mobile telephone. Such digital audio device 400 comprises a digital audio recorder chain 401 and a digital audio player chain 411. The other electronic components of the mobile telephone 400 operatively connected to both the audio chains, are not illustrated in the FIG. 4.

The digital audio recorder chain 401 comprises a microphone 402.

Such digital audio recorder chain 401 further comprises a microphone pre-amplifier 403.

In addition, the digital audio recorder chain 401 comprises an Analog-to-Digital Converter 200 (or 300) of the type described above with reference to any of the embodiments of the invention (FIGS. 2-3).

Moreover, the digital audio recorder chain 401 further comprises a digital filter 404.

The digital audio player chain 411 comprises:
a further digital filter 412;
a Digital-to-Analog Converter 413;
a transducer amplifier 414, and
a speaker 415.

The multi-level sigma-delta AD converter of the invention has the advantage that the quantizer complexity does not change with the increase of the number of output levels of the converter, as explained above.

Furthermore, the accuracy and complexity of the quantizer 3 is relaxed respect to the other multi-level sigma-delta DA converter already known because its output digital signal (converted in the corresponding analog signal) is injected in the second stage of the multi-level sigma-delta AD converter (computation block S2, first amplification block A2 and analog integrator 2 of the direct path d1 of both the converter 200 and the converter 300).

In addition, with respect to converter of the prior art, the converter of the invention has an alternative arrangement which is more simple because it comprises analog integrator of the first order.

Furthermore, the fact to have a first amplification block (A2) in the direct path d1 of the converter having a gain factor which is the inverse of the gain factor of the amplification block (A0) present in the first feedback path f1 allows to substantially obtain the cancellation of the amplitude introduced by the first feedback path f1 in the direct path d1, i.e. in the third analog signal X3 present at the input terminal I3 of the quantizer 3.

Lastly, it should be noted that the embodiment of FIG. 3 allows employing a quantizer 3' having a reduced accuracy than the quantizer of the embodiment of FIG. 2 by (simply) increasing of a preset value (e.g. 4) the gain factor of the first amplification block A2' of the direct path d1 and reducing of the same preset value the gain factor of the amplification block A0' present in the first feedback path f1.

The invention claimed is:

1. A multi-level sigma-delta Analog-to-Digital converter comprising:
a direct path having an input terminal to receive an input analog signal and an output terminal to provide an output digital signal corresponding to said input analog signal, said direct path comprising:
a computation block arranged to receive a first analog signal representative of the input analog signal and to provide an analog computed signal;
a first order analog integrator having an input terminal operatively associated to the computation block to receive the analog computed signal and an output terminal to provide a third analog signal,
a quantizer having a respective input terminal operatively connected to the output terminal of the first order analog integrator and a respective output terminal operatively connected to the output terminal of the direct path;
a first amplification block interposed between said computational block and the input terminal of the quantizer; and
a digital integrator block interposed between the output terminal of the quantizer and the output terminal of the converter, the digital integrator block being configured so that an output digital sample present at the output terminal of the direct path is added back directly at the output terminal of the quantizer; and
a first feedback path arranged to provide to the computation block a feedback analog signal representative of a digital signal present at the output terminal of the quantizer, said computation block being arranged to subtract said feedback analog signal from the first analog signal so that the output digital sample present at the output terminal of the quantizer is subtracted from the first analog signal, said first feedback path comprising an amplification block having a respective gain factor, said first amplification block of the direct path having a respective gain factor which is the inverse of the gain factor of the amplification block of the first feedback path.

2. The converter of claim 1, further comprising a second feedback path arranged to provide to the computation block a further feedback analog signal representative of the output digital signal present at the output terminal of the direct path, said computation block being arranged to subtract said further feedback analog signal from the first analog signal.

3. The converter of claim 2, wherein the direct path comprises a further analog integrator having an input terminal operatively connected to said input terminal of the direct path and an output terminal operatively connected to the computation block to provide it the first analog signal representative of the input analog signal of the direct path.

4. The converter of claim 3, wherein the direct path comprises a further computation block arranged to receive the input analog signal and to provide a further analog computed signal to the further analog integrator.

5. The converter of claim 4, wherein the second feedback path is further arranged to provide the feedback analog signal to the further computation block, said further computation block being arranged to subtract said further feedback analog signal from the first analog signal.

6. The converter of claim 5, wherein the direct path further comprises a second amplification block interposed between the further computation block and the computation block, said second amplification block having a respective gain factor.

7. The converter of claim 1, wherein the first amplification block of the direct path is interposed between the computation block and the first order analog integrator.

8. The converter of claim 1, wherein the first amplification block of the direct path is interposed between the first order analog integrator and the quantizer.

9. The converter of claim 6, wherein the second amplification block of the direct path is interposed between the further computation block and the further analog integrator.

10. The converter of claim 6, wherein the second amplification block of the direct path is interposed between the further analog integrator and the computation block.

11. The converter of claim 1, wherein the first feedback path further comprises a Digital-to-Analog converter interposed between the output terminal of the quantizer and the amplification block.

12. The converter of claim 2, wherein the second feedback path comprises a further Digital-to-Analog converter.

13. The converter of claim 4, wherein the computation block and the further computation block are configured to change from positive to negative the sign of the feedback analog signals received from the feedback paths.

14. A digital audio device comprises the converter of claim 1.

* * * * *